Aug. 4, 1970 J. M. SOKOLICH 3,522,598

SEMICONDUCTOR VOLTAGE GENERATOR ANALOG TO DIGITAL AND DIGITAL TO ANALOG CONVERSION DEVICE

Filed Nov. 21, 1966 2 Sheets-Sheet 1

INVENTOR.
JAMES M. SOKOLICH
BY Herbert L. Davis
ATTORNEY

INVENTOR.
JAMES M. SOKOLICH
BY Ronald G. Gillespie
ATTORNEY

United States Patent Office 3,522,598

Patented Aug. 4, 1970

3,522,598

SEMICONDUCTOR VOLTAGE GENERATOR ANALOG TO DIGITAL AND DIGITAL TO ANALOG CONVERSION DEVICE

James M. Sokolich, Cliffside Park, N.J., assignor to The Bendix Corporation, a corporation of Delaware Filed Nov. 21, 1966, Ser. No. 595,765

Int. Cl. H03k *13/02*

U.S. Cl. 340—347 12 Claims

ABSTRACT OF THE DISCLOSURE

This invention relates to an analog to digital and digital to analog converter utilizing an electromagnetic core with signals provided through attendant core windings, a Hall effect voltage generator in spatial relation to said core in combination with attendant feedback circuitry used to null the magnetic field which had been created in said core by the aforesaid input signal.

BACKGROUND OF THE INVENTION

Field of the invention

This disclosure relates to electrical signal converter networks and more particularly to the conversion of analog signals to their digital equivalents and conversion of digital signals to their analog equivalents.

Description of the prior art

Prior analog to digital and digital to analog converters have been in the form of high precision resistor networks, null seeking devices utilizing ferromagnetic cores, such as disclosed and claimed in U.S. Pat. No. 3,079,598 granted Feb. 26, 1963 to S. Wald or of a type utilizing knowledge of the time required for an event to occur, such as a phase shift so as to derive digital information from an analog signal as disclosed and claimed in U.S. Pat. No. 2,975,411, granted Mar. 14, 1961 to H. L. Hanson.

There are severe limitations inherent in all the above mentioned devices. For example, in the resistive circuit analog to digital and digital to analog converter, resistors of extremely high precision are required to obtain accurate conversions. This in turn compels frequent component replacement as resistor values vary over a wide range due to degradation caused by extended use.

An analog to digital converter of a type disclosed in U.S. Pat. No. 3,079,598 supra is limited by the fact that it can accept only an alternating current signal as its analog input and will not function properly if the analog signal desired to be converted is in the form of a D.C. electrical signal. This is due to the fact that though a D.C. signal will cause magnetic flux to flow in an electromagnetic core, another winding disposed about said core cannot have a voltage caused to appear across it, because the voltage appearing across the winding of an inductive coil is proportional to the rate of change of the current through the inductor with respect to time and where there is not a time varying magnetic field in the electromagnetic core no voltage will appear across said inductive coil.

Devices of the type disclosed in U.S. Pat. No. 2,975,411 are limited by the fact that as designed they will accept an analog signal only in the form of a D.C. electrical signal and the method of conversion requires (a) a saturable core mechanism referred to as a magnetor at column 1, lines 56–60 of the aforesaid patent and (b) counting the number of waves between phase shifts to convert the analog signal to a digital signal as indicated at column 2, lines 14–20 of said patent.

SUMMARY OF THE INVENTION

The present invention contemplates a simple and comparatively inexpensive construction providing a nulling procedure which utilizes a Hall effect voltage generator. It is capable of both analog to digital and digital to analog conversion wherein the analog or digital input signal may be either an A.C. or D.C. electrical signal.

A Hall effect voltage generator such as utilized in the present invention is a semiconductor device with characteristics such that when it is placed perpendicular to a magnetic field, and a control current is then applied to an edge of the semiconductor device, with said edge also being perpendicular to the magnetic field, a voltage is generated between two edges of said Hall device, this voltage being measured at edges which are both perpendicular to the edge to which the input control current is applied and in the plane of the Hall effect device. The voltage measured is equal to $R_h I_c B/t$ where B is the strength of the aforesaid magnetic field, $R_h$ is the Hall constant for the particular semiconductor material, $I_c$ is the applied control current, and $t$ is the thickness of the material of the Hall effect device. The magnitude of the output voltage is thus directly proportional to the magnitude of the product of the input control current and the applied magnetic field and the frequency of the output voltage is a function of the frequency of the aforesaid two parameters, where said frequencies may be of any frequency from D.C. to a frequency in the megacycle range.

The operation of a Hall effect voltage generator is discussed in Space Aeronautics, May 1961, volume 35 #145 at pages 145 and 146 and a theoretical discussion appears in Shockley, Electrons & Holes in Semiconductors, D. Van Nostrand Co., at pages 270–282 and 336–342.

It is another object within the contemplation of the instant invention to provide a converter which will perform both analog to digital and digital to analog conversions by means of a nulling process which utilizes a Hall effect voltage generator.

It is another object of the instant invention to provide a novel analog to digital and digital to analog converter which is smaller and has a greater accuracy than existing analog to digital or digital to analog converters.

It is another object of the instant invention to provide a novel analog to digital and digital to analog converter which greatly reduces temperature and aging effects as compared to previous devices, thereby extending the range of usefulness of the converter.

It is another object of the instant invention to provide a novel analog to digital and digital to analog converter making use of a nulling process by means of an attendant feedback circuit.

It is another object of the instant invention to provide a novel analog to digital and digital to analog converter wherein the feedback circuit used in the nulling process makes use of a Hall effect voltage generator.

It is another object of the instant invention to provide a novel analog to digital and digtal to analog converter which can convert either A.C. or D.C. electrical signals.

These and other objects and features of the invention are pointed out in the following description in terms of the embodiments thereof which are shown in the accompanying drawings. It is to be understood, however, that the drawings are for the purpose of illustration only and are not a definition of the limits of the invention, reference being had to the appended claims for this purpose.

Figures 1, 2:
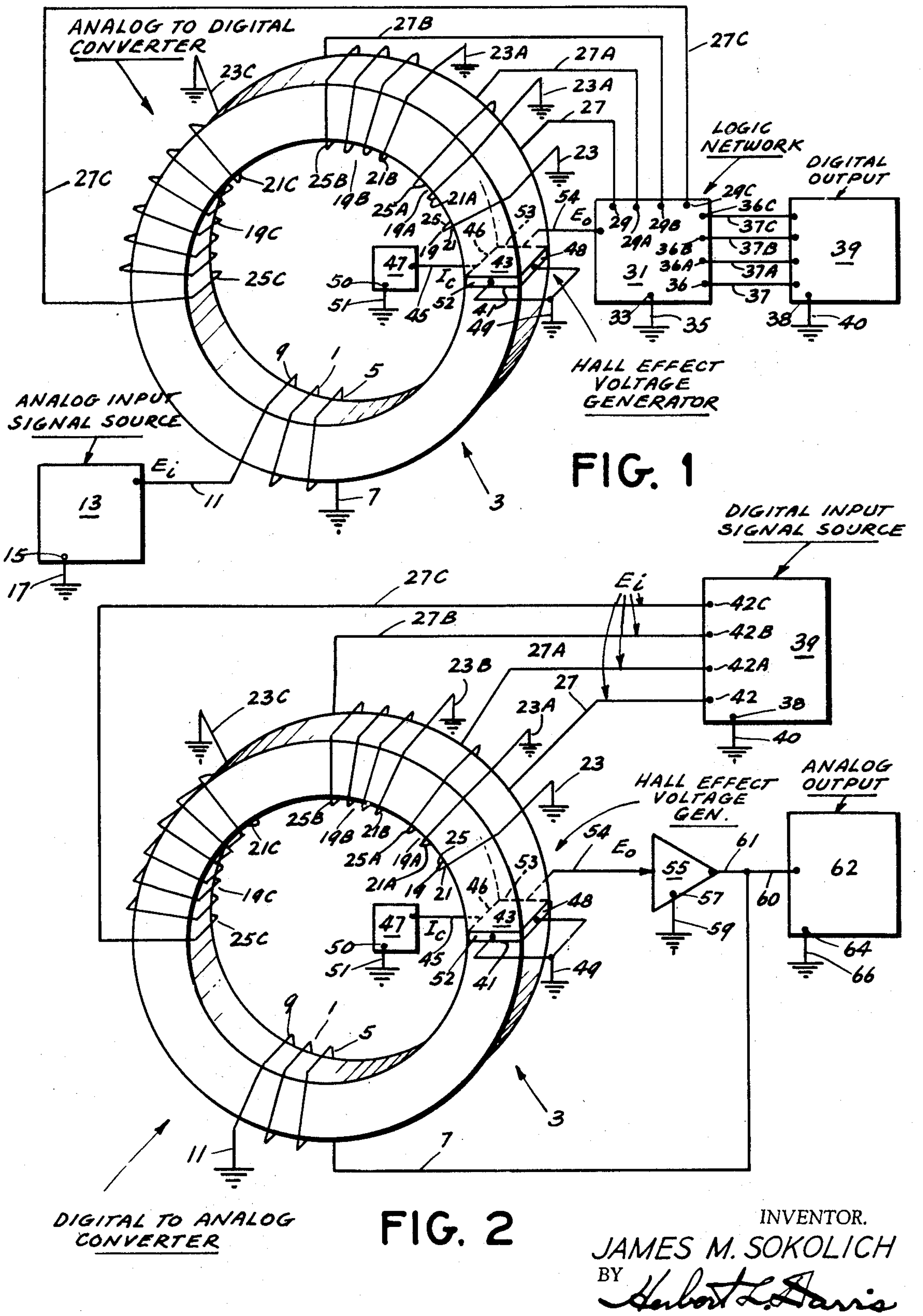
FIG. 1 is a schematic diagram embodying the invention in the form of an analog to digital converter.
FIG. 2 is a schematic diagram embodying the invention in the form of a digital to analog converter.

Referring to the drawing of the analog to digital converter of FIG. 1, a winding 1 is disposed about a low retentivity magnetc core 3 with an end or leg 5 of the winding 1 connected through a conductor 7 to ground while an opposite end or leg 9 is connected through a conductor 11 to an output terminal of a suitable electrical analog signal source 13 having an output terminal 15 connected through a conductor 17 to ground and arranged to provide an analog output electrical signal $E_i$ which may be either A.C. or D.C. applied through the conductors 7 and 11 across the winding 1.

A winding 19 is disposed about the low retentivity magnetic core 3 with an end or leg 21 connected through a conductor 23 to ground while the other end or leg 25 is connected through a conductor 27 to an output terminal 29 of a logic network 31. A plurality of similar windings with corresponding numbers as indicated at 19A, 19B and 19C are disposed about said core 3, with corresponding legs 21A, 21B and 21C connected to ground and corresponding legs 25A, 25B and 25C connected to output terminals bearing the corresponding numerals 29A, 29B and 29C of said logic network 31.

The logic network 31 has an input-output terminal 33 connected to ground through a conductor 35 and also has appropriate output terminals 36, 36A, 36B and 36C connected through output conductors 37, 37A, 37B, 37C, to a suitable digital control network 39.

The low magnetic retentivity core 3 is constructed so as to have an air gap 41 in which is placed a thin rectangle of semiconductor material 43 of a type provided for measuring magnetic field strength such as a Hall effect type voltage generator. The voltage generator 43 is provided with an input control current $I_c$ applied through a conductor 45 to an edge 46 of the rectangle of semiconductor material 43 from a controlled direct current source 47 while an opposite edge 48 is connected to ground by a conductor 49 and thereby to an output terminal 50 of the source 47 connected through a conductor 51 to ground.

Figure 3:
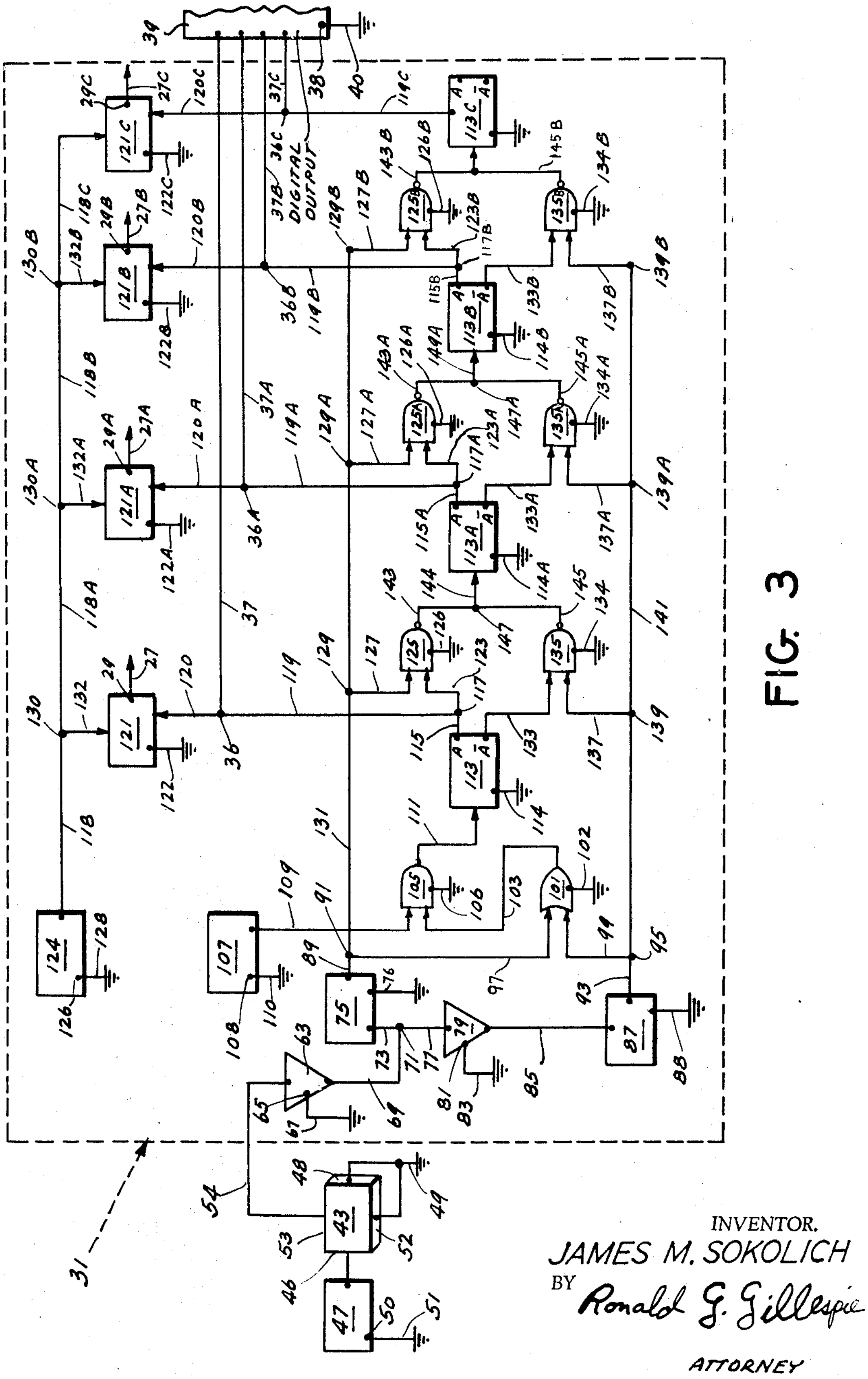
FIG. 3 is a schematic drawing of a logic network utilized in the invention.

The rectangle of semiconductor material 43 is placed with its plane at right angles to a magnetic field generated across the air gap 41 of the core 3 and has opposite edges 52 and 53 extending at right angles to the edges 46 and 48 with the edge 52 connected to ground through the conductor 49 and the opposite edge 53 connected through a conductor 54 to an input of the logic network 31 which may be of a type such as that shown by FIG. 3. The Hall effect voltage generator 43 then provides an output electrical signal voltage $E_0$ thtrough the conductor 54 to the aforesaid logic network 31 upon a current flow from edge 46 to edge 48 which current flow extends parallel to the edges 52 and 53, since the rectangle of semiconductor material has been placed with its plane at right angles to the magnetic field across the gap 41.

The logic network 31, as shown by FIG. 3, is connected through the conductor 54 to the output of the Hall effect generator 43. The conductor 54 in turn leads to an input terminal of an operational amplifier 63 which may be of a type having a self-contained power supply and an input-output terminal 65 connected through a conductor 67 to ground.

The amplifier 63 of the logic network 31 is connected through an output conductor 69 to a junction 71, said junction 71 being connected through a conductor 73 to an input of a Schmitt trigger 75 of conventional type having an input-output terminal connected through a conductor 76 to ground.

Junction 71 is also connected through a conductor 77 to an input of a unity gain inversion amplifier 79 which is also of a conventional type. The inversion amplifier 79 has an input-output terminal 81 connected through a conductor 83 to ground. The output of said inversion amplifier 79 provides an input electrical signal through a conductor 85 to a second Schmitt trigger 87 of conventional type having an input-output terminal connected through a conductor 88 to ground.

The Schmitt trigger 75 has an output connected through a conductor 89 to a junction 91 while the Schmitt trigger 87 has an output connected through a conductor 93 to a junction 95. Junctions 91 and 95 are connected through conductors 97 and 99 respectively to input terminals of an OR gate 101 of conventional type having a grounded input-output conductor 102. The output of the OR gate 101 provides an electrical signal through a conductor 103 to one input of an AND gate 105 having a grounded input-output conductor 106.

A pulse train is provided by an electronic clock 107 of conventional type having an input-output terminal 108 connected through a conductor 110 to ground. This pulse train is applied through an output conductor 109 to another input terminal of the aforesaid AND gate 105. The AND gate 105 applies through an output conductor 111 an input signal to a bistable multivibrator 113 of conventional type having a grounded input-output conductor 114.

The bistable multivibrator 113 is of a type having two conductive states, said states being activated by the electrical energy applied at the input of the bistable multivibrator 113 through the output conductor 111 leading from the AND gate 105. The AND gate 105 has two states, each representing a logic level and it is the negative going transitions occurring during changes of the output signal of said AND gate 105 which causes the change of output states of bistable multivibrator 113 from its A to its $\bar{A}$ state and from its $\bar{A}$ to its A state. Said states are so arranged that in one or A state there is applied an electrical signal through an output conductor 115 to a junction 117 while in the other or $\bar{A}$ state there is an electrical signal through an output conductor 133. The junction 117 is connected through a conductor 119 to the output terminal 36 heretofore referred to with reference to FIG. 1 from which leads the output conductor 37 of the network 31 to the digital control network 39.

Further, as shown by FIG. 3, the terminal 36 is also connected through a conductor 120 to a switching network 121 of conventional type having an input-output terminal connected to ground through a conductor 122. The switching network 121 is arranged so as to selectively open and close a path for applying energy from a controlled current source 124 through an output conductor 118 and the switching network 121 to the output terminal 29 and conductor 27 leading to the core winding 19 heretofore referred to with reference to FIG. 1.

The controlled current source 124 has an input-output terminal 126 connected through a conductor 128 to ground and an output conductor 118 leading to a junction 130 and thereby through a conductor 132 to the switching network 121 operable to close a path to the output conductor 27 leading from the switching network 121, as hereinafter explained in greater detail.

The output terminal 36 of the logic network 31 provides an output electrical signal in digital form applied through the conductor 37 to the digital control network 39. Junction 117 is also connected through a conductor 123 to one input terminal of a NAND gate 125 having a grounded input-output terminal 126. The NAND gate 125 is also provided with an input signal through a conductor 127 connected to a junction 129 which is in turn connected through a conductor 131 to a junction 91 on the output conductor 89 leading from the Schmitt trigger 75.

The other or $\bar{A}$ state of the two conductive states of the aforesaid bistable multivibrator 113 is so arranged that upon the second conductive state being effective, said bistable multivibrator 113 applies a voltage through the conductor 133 leading to one input terminal of a NAND gate 135 having a grounded input-output terminal 134. Another input of said NAND gate 135 is provided through a conductor 137 connected to a junction 139 on a conductor 141 leading in turn to a junction 95 on the output conductor 93 from the Schmitt trigger 87.

The output electrical signals of said NAND gates 125 and 135 are connected through conductors 143 and 145 respectively to a junction 147 which in turn provides an input electrical signal through a conductor 149 to a second bistable multivibrator 113A.

The aforesaid circuitry including switch 121, bistable multivibrator 113, NAND gates 125 and 135 and the appropriate connecting conductors will now become repetitive as indicated in FIG. 3 by corresponding parts indicated by like numerals bearing sequential subscripts.

OPERATION OF ANALOG TO DIGITAL CONVERTER OF FIGS. 1 AND 3

In the operation of the analog to digital converter of FIG. 1, the electrical signal $E_i$ is applied to a low magnetic retentivity core 3 from the analog input signal source 13. The electrical signal applied by the source 13 to the low magnetic retentivity core 3 may be an A.C. or D.C. analog expression. This signal is impressed upon the core 3 through the winding 1 disposed about said core 3 so as to create a magnetic field which flows through the core 3 and the attendant air gap 41 wherein the Hall effect voltage generator 43 has been placed in a plane perpendicular to the lines of the magnetic field.

Where, as may be the occasion in the instant device, the magnitude and frequency of the aforesaid magnetic field is a function of an analog input signal, and it is desired to have a signal returned which is of the same frequency as the original input signal so that a nulling process may occur, the frequency of the control current may be set to zero, that is, to D.C. In such configuration the frequency of the output signal of the Hall effect voltage generator, and thus the frequency of the electrical signal returned which is to be used to null the magnetic field created by the signal which is to be converted, will now be equal to the frequency of the input excitation.

A D.C. control current $I_c$, provided by source 47, is applied to said Hall effect voltage generator 43 so that the combination of the aforesaid control current $I_c$ and magnetic flux will cause a voltage to appear at the output of said Hall effect voltage generator 43. This voltage is the input signal to the logic network 31 which activates switches connected to windings 19, 19A, 19B, 19C, which are disposed about the aforesaid core, the magnetic field provided by these latter windings being used to oppose the magnetic field which is a function of the aforesaid analog signal. When the condition obtains where there no longer is a magnetic field in the low magnetic retentivity core 3 due to the action of the analog input electrical signal and the opposing action of the windings 19, 19A, 19B, 19C, chosen by the aforesaid logic circuit 31 no signal will appear at the output of the Hall effect voltage generator 43 and thus there will no longer be an input electrical signal to the logic circuit 31. At this point the digital equivalent of the analog signal appears on the conductors 37, 37A, 37B, 37C, connected to the output of the logic circuit which are the input conductors to a digital network 39.

In the drawing of FIG. 1, the windings 19, 19A, 19B, 19C, have been drawn in a binary progression for purposes of clarity in discussion. It will be understood that other configurations may be used. For example, rather than equal current sources, shown in FIG. 3 as controlled current source 124, providing electrical energization to the respective windings 19, 19A, 19B, 19C, the windings may all be of equal turns while the energization may be supplied by various current sources of values as in a binary progression. A further modification would be to have windings constructed with the respective turns in a binary progression thus utilizing a current source or current sources of equal value as electrical energization while the higher order windings would, for purposes of controlling the size of the device, contain only half the turns dictated by the binary progression while the electrical energization to these windings would be supplied through one of the original constant current sources and a current doubling circuit.

Further, the logic circuit of FIG. 3 shown in the operation of the device of FIG. 1 is a typical serial counting circuit arrangement of standard design, although a typical parallel counting circuit may also be utilized.

The mode of operation of this logic circuit is such that when the Hall effect voltage generator 43 has an output electrical signal $E_o$ as carried on the conductor 54, this signal is the input to an amplifier 63, the function of which is to amplify the small voltage outputs of the Hall device and raise the voltage level to a value where it may be used to operate a subsequent circuit. The amplifier, as shown, also has an inversion characteristic, i.e. it will reverse the polarity of signals applied to said amplifier 63 from the Hall device 43. In the case where the analog input signal is in the form of an A.C. electrical signal, the amplifier 63 will also have a demodulator portion so it may have a polarized output for purposes of determining whether to count up or down.

In the case where the output of the Hall device 43 is negative with respect to a D.C. analog input signal or 180° out of phase with an A.C. analog input signal and the signal output from the controlled current source 124 which is in phase with and of the same frequency as the analog signal, the signal from amplifier 63 will be positive or in phase as it is applied through the conductor 69 to the junction 71. At this point it is the input through the conductor 73 to the Schmitt trigger 75 and it is also an input signal through the conductor 77 to the inverter 79 which again changes the sign or phase of the aforesaid electrical signal and will thus not now activate Schmitt trigger 87. The output of Schmitt trigger 75 through conductors 89 and 97 will activate the OR gate 101, the output of which is provided through a conductor 103 to one input of an AND gate 105, another input of said AND gate being a clock pulse provided by a clock 107 through a conductor 109. The output of said AND gate which will now be in a high position is provided through a conductor 111 to the bistable multivibrator 113.

Assuming now that the counter was in a state corresponding to a 0001 digital configuration, it will be seen that an output signal from the Hall device 43 which is negative or 180° out of phase with the analog input signal and the aforesaid controlled current source signal will result in a process of counting down.

By providing in this example that the configuration of the logic circuit was in the 0001 configuration, it will be seen that switch 121 was closed, allowing the energization from controlled current source 124 to be carried on the conductor 27 while switches 121A, 121B, 121C, were in the deactivated or open configuration. It will also be seen that bistable multivibrator 113 had its A state activated and its $\bar{A}$ state deactivated. The aforesaid input signal provided to bistable multivibrator 113 through conductor 111 will now change the state of said bistable multivibrator 113 and the $\bar{A}$ state of bistable multivibrator 113 will now be activated. This will of course result in the removal of excitation from switch 121 which is connected to the A state of bistable multivibrator 113 through junction 36 and conductor 119.

The bistable multivibrators 113, 113A, 113B, of which bistable multivibrator 113 is representative are responsive only to the negative going transitions of input pulses. For this reason bistable multivibrator 113 will deactivate its A state and have its $\overline{A}$ state activated upon the removal of the aforesaid clock pulse to one input of the AND gate 105 which will in turn cause the output of AND gate 105 to go from its high output state to its low output state.

Under the present hypothesis the logic circuit has now activated or deactivated the proper core windings 19, 19A, 19B, 19C, which results in a nulling of the magnetic field B existing in core 3 which in turn results in the absence of an electrical excitation from the Hall effect voltage generator 43 to the logic circuit. Neither Schmitt triggers 75 or 87 will now provide energization to junctions 129, 129A, 129B, nor to junctions 139, 139A, 139B, and thus the inputs to NAND gates 125, 125A, 125B, and NAND gates 135, 135A, and 135B through conductors 127, 127A and 127B and conductors 137, 137A, and 137B, respectively, will not be of a proper value to activate said NAND gates. The other inputs to NAND gates 125 and 135 will be the A and $\overline{A}$ states through conductors 115–123 and 133 respectively. The output signal of both NAND gates will be high states, but until another count up or count down signal is received, this high state will be continually applied through a conductor 149 to bistable multivibrator 113A. Since it has been previously indicated that the bistable multivibrators are in such configuration that they will react to the negative going transitions of input signals and it has just been seen that a high input signal will be continually applied to bistable multivibrator 113A, it will be seen that the output of said bistable multivibrator 113A will not change. Thus switch 121A will remain in its open position, and the same discussion will pertain to the remaining bistable multivibrators 113B, 113C, in the logic circuit.

Assuming again that the logic circuit is in the 0001 configuration, a counting up procedure will now be discussed. The output of the Hall device 43 will now be positive or in phase with the analog input signal and the controlled current source input signal to switches 121, 121A, 121B, and 121C through conductor 118, junction 130 and conductor 132. This will result in a negative signal being provided to junction 71 through a conductor 69. This negative signal which is provided through a conductor 73 to an input of Schmitt trigger 75 will not activate said Schmitt trigger and there will therefore be no signal provided through a conductor 89 to junctions 91, 129, 129A and 129B. Said negative signal at junction 71 is also provided through a conductor 77 to an inverter 79 resulting in a positive signal being provided through a conductor 85 to Schmitt trigger 87 which will in turn provide a signal through a conductor 93 to junctions 95, 139, 139A and 139B. This signal at junction 95 is provided through a conductor 99 to OR gate 101 which in turn provides one input to AND gate 105 through a conductor 103. Another input is provided to said AND gate through a conductor 109 from clock 107. When this clock pulse is present the output of said AND gate 105 is high and this signal is provided through a conductor 111 to bistable multivibrator 113 which, according to our hypothesis, has its A state activated and its $\overline{A}$ state deactivated. The removal of the clock pulse will, as before discussed, result in the removal of excitation provided to bistable multivibrator 113 through a conductor 111, which will in turn result in the A state of said bistable multivibrator becoming deactivated and the $\overline{A}$ state becoming activated. This in turn will cause switch 121 to go to its open position.

All of the steps here discussed are identical to those previously discussed in the counting down procedure, the difference now being that the nulling process in the low magnetic retentivity core 3 has not been completed and therefore there will be an input from the Hall effect voltage generator 43. The inputs to NAND gate 125 through conductors 115 and 123 are now low and they therefore result in a high output from said NAND gate as was the previous condition. The input signals to NAND gate 135 through conductors 133 and 137 are now high and high respectively resulting in a low output from said NAND gate whereas the prior condition had been a high output from said NAND gate. This will result in a low input through a conductor 149 to bistable multivibrator 113A which is a change from the high input previously provided from said bistable multivibrator.

As previously stated it is the negative going transition of an input pulse which causes a state change in the bistable multivibrators used in the instant circuit. Therefore the change from a high input signal to a low input signal to bistable multivibrator 113A will cause said bistable multivibrator to change state from its previously hypothesized $\overline{A}$ state being activated to its A state being activated. The signal provided by the A state of bistable multivibrator 113A in turn will provide an input to switch 121A which will in turn cause energization of the proper winding, in this case core winding 19A resulting in a 0010 digital count. A null in the core 3 will now result with the consequence that there is no longer an input to the Hall effect voltage generator 43 and the logic circuit will become quiescent.

Now, as before, all other bistable multivibrators in the logic circuit will remain in their present configuration and will do so until such time as a different analog input signal is applied resulting in the absence of a null in core 3 whereupon the logic circuit will again count up or down as the case may be in order to again cause a null in said core.

DIGITAL TO ANALOG CONVERTER OF FIG. 2

Referring to the drawing of the digital to analog converter of FIG. 2, a winding 19 is disposed about the low magnetic retentivity core 3 with one end or leg 21 connected through a conductor 23 to ground while an opposite end or leg 25 is connected through a conductor 27 to an output terminal 42 of a suitable digital electrical signal source 39 having a grounded output conductor 40. The output signal provided by the source 39 may be either A.C. or D.C. and is in parallel digital form. A plurality of similar windings with corresponding members are disposed about said core 3 with corresponding legs connected to ground and with corresponding legs also connected to electrical input signals. These signals are also in parallel digital form and are applied at output terminals 42, 42A, 42B and 42C of the aforesaid digital electrical signal source 39.

The low magnetic retentivity core 3 is constructed so as to have an air gap 41 in which a Hall effect voltage generator 43 is placed in a configuration similar to that heretofore discussed in the description of FIG. 1.

The Hall effect voltage generator is provided with an input control current $I_c$ applied through a conductor 45 leading from a controlled current source 47 having an output terminal 50 connected through a conductor 51 to ground. An output electrical signal $E_0$ from said Hall device 43 provides an input signal through a conductor 54 to an operational amplifier 55 having an input-output terminal 57 connected through a conductor 59 to ground. The output of said operational amplifier 55 provides electrical energization through conductors 61 and 7 to a winding 1 through an end or leg 5 of said winding, said winding 1 being disposed about said low magnetic retentivity core 3, the other end or leg 9 of said winding 1 being connected through a conductor 11 to ground.

The output of the operational amplifier 55 also provides, through a conductor 60, the aforesaid electrical energization, said energization being the analog representation of the parallel digital input signal.

This signal carried by conductor 60 is provided at an input of an electrical network 62, having an input-output terminal 64 connected to ground through a conductor 66, and which electrical network 62 may be of a conventional type designed to utilize the analog representation of the digital signal.

For ease of visualization, the windings 19, 19A, 19B and 19C disposed about core 3, as shown in FIG. 1, have been indicated as wound in a binary progression. This configuration is not mandatory to insure proper operation of the device and other methods, such as having the current signals from the digital signal source 39 appearing on conductors 27, 27A, 27B and 27C progress in a binary sequence while all core windings of equal turns, may be utilized.

OPERATION OF DIGITAL TO ANALOG CONVERTER OF FIG. 2

Now viewing the instant device of FIG. 2 as a digital to analog converter, it will be seen that when a parallel digital input electrical signal $E_i$ as provided by digital circuit 39, as shown in FIG. 2, is applied to the low magnetic retentivity core 3 through the core windings 19, 19A, 19B, 19C related in a binary progression, a magnetic flux will be produced in the low magnetic retentivity core 3 and attendant air gap 41.

The Hall effect voltage generator 43 is placed in said air gap 41 in a plane perpendicular to the magnetic flux and is further provided with a D.C. control current $I_c$ from the controlled source 47 so as to generate an electrical signal $E_o$ appearing at conductor 54 which is an input signal to the operational amplifier 55. The output of said operational amplifier 55 carried by the conductor 61 provides an analog signal and since the conductor 61 is also connected to conductor 7 leading to the winding 1 disposed about said core 3 this analog signal acts to null the magnetic field in said core, said magnetic field having been provided by the windings 19, 19A, 19B, 19C, carrying the electrical signals corresponding to the digital information.

As before, when there no longer is a magnetic field in the low magnetic retentivity core 3, there will be no output signal $E_o$ from the Hall effect voltage generator 43 and the stable electrical signal output of the operational amplifier 55 will be an analog signal corresponding to the digital input electrical signal from the source 39.

While two embodiments of the invention have been illustrated and described, various changes in the form and relative arrangements of the parts, which will now appear to those skilled in the art may be made without departing from the scope of the invention. Reference is, therefore, to be had to the appended claims for a definition of the limits of the invention.

What is claimed is:

1. An electrical signal converter comprising an electromagnetic core, first means in an operative relation to said core for providing an electrical input signal to said core of a corresponding analog significance and producing therein a magnetomotive force in response to said analog signal, second means including a semiconductor device in an operative relation to said core and responsive to the magnetomotive force in said core for effecting an electrical signal, third means connected to the second means and responsive to the electrical signal from said second means for simultaneously effecting a pair of electrical output signals, including means connected to the second means and responsive to the electrical signal from said second means for providing trigger pulses and a counting direction signal, an up-down counter connected to the trigger means for counting the trigger pulses in a direction in accordance with the direction signal and providing an output corresponding to the count, and means connected to the counter and responsive to the output from the counter for providing the pair of electrical output signals, one of said electrical output signals being of a digital significance corresponding to said input analog signal, and fourth means connected to the third means and arranged in an operative relation to the aforesaid core and responsive to said other electrical output effected by said third means acting in a sense to null the magnetomotive force in said electromagnetic core.

2. The converter defined by claim 1 in which the first means includes at least one electromagnetic core winding providing the input analog electrical signal to the electromagnetic core for effecting therein a magnetomotive force responsive to said analog electrical signal.

3. The converter defined by claim 2 in which the second means includes a current source connected to said semiconductor device for providing an energization thereto of a predetermined magnitude.

4. The converter defined by claim 3 in which the second means includes a Hall effect voltage generator arranged in cooperative relation with the electromagnetic core so as to provide an electrical signal dependent upon the energization provided by the aforesaid current source and responsive to the magnetomotive force in said electromagnetic core.

5. The converter defined by claim 4 in which the fourth means includes at least one electromagnetic core winding energized by an electrical signal applied at an output from the third means for nulling the magnetomotive force in the electromagnetic core effected by the analog input electrical signal to the first means.

6. The converter defined by claim 4 including the electromagnetic core being of a toroidal shape having opposite ends positioned in a spaced relation, and the Hall effect voltage generator being positioned between the opposite ends of the toroidal electromagnetic core and perpendicular to the magnetomotive force in said toroidal electromagnetic core.

7. An electrical signal converter comprising an electromagnetic core, first means in an operative relation to said core for providing an electrical input signal to said core of a corresponding parallel digital significance and producing therein a magnetomotive force in response to said digital signal, second means including a semiconductor device in operative relation to said core and responsive to the magnetomotive force in said core for effecting an electrical signal, third means connected to the second means and responsive to the electrical signal from said second means for providing an analog output signal, and fourth means connected to the third means arranged in an operative relation to the aforesaid core and responsive to the output signal from said third means for nulling the magnetomotive force in said electromagnetic core.

8. The converter defined by claim 7 in which the first means includes at least one electromagnetic core winding providing the input parallel digital electrical signal to the electromagnetic core for effecting therein a magnetomotive force responsive to said parallel digital electrical signal.

9. The converter defined by claim 8 in which the second means includes a current source connected to said semiconductor device for providing an energization thereto of a predetermined magnitude.

10. The converter defined by claim 9 in which the second means includes a Hall effect voltage generator arranged in cooperative relation between opposite ends of the electromagnetic core so as to provide an electrical signal dependent upon the energization provided by the aforesaid current source and responsive to the magnetomotive force in said electromagnetic core.

11. The converter defined by claim 10 in which the fourth means includes at least one electromagnetic core winding energized by an electrical signal at an output from the third means for nulling the magnetomotive force in the electromagnetic core effected by the parallel digital input electrical signal to the first means.

12. The converter defined by claim 11 including the electromagnetic core being of a toroidal shape and having opposite ends positioned in spaced relation one to the other and the Hall effect voltage generator being positioned between the opposite ends of the core and perpendicular to the magnetomotive force in said toroidal electromagnetic core.

References Cited

UNITED STATES PATENTS

| | | | |
|---|---|---|---|
| 3,121,788 | 2/1964 | Hilbinger | 307—309 |
| 3,079,598 | 2/1963 | Wald | 340—347 |
| 2,979,668 | 4/1961 | Dunlap | 307—309 |
| 2,975,411 | 3/1961 | Hanson | 340—347 |
| 2,924,673 | 2/1960 | Dunker | 179—170 |

MAYNARD R. WILBUR, Primary Examiner

J. GLASSMAN, Assistant Examiner